United States Patent [19]
Agarwal et al.

[11] Patent Number: 5,923,058
[45] Date of Patent: Jul. 13, 1999

[54] ALUMINUM GALLIUM NITRIDE HETEROJUNCTION BIPOLAR TRANSISTOR

[75] Inventors: Anant K. Agarwal, Monroeville; Rowan L. Messham, Murrysville; Michael C. Driver, McKeesport, all of Pa.

[73] Assignee: Northrop Grumman Corporation, Los Angeles, Calif.

[21] Appl. No.: 08/795,807

[22] Filed: Feb. 5, 1997

Related U.S. Application Data

[62] Division of application No. 08/555,935, Nov. 9, 1995, Pat. No. 5,641,975.

[51] Int. Cl.$^6$ ................................................. H01L 29/737
[52] U.S. Cl. ........................................... 257/198; 257/76
[58] Field of Search .............................. 257/76, 197, 198, 257/103

[56] References Cited

U.S. PATENT DOCUMENTS

| | | | |
|---|---|---|---|
| 2,569,347 | 9/1951 | Shockley | 257/198 |
| 4,985,742 | 1/1991 | Pankove | 257/197 |
| 5,010,382 | 4/1991 | Katoh | 257/15 |
| 5,122,845 | 6/1992 | Manabe et al. | 257/76 |
| 5,326,992 | 7/1994 | Yoder | 257/77 |
| 5,378,921 | 1/1995 | Ueda | 257/574 |
| 5,393,993 | 2/1995 | Edmond et al. | 257/77 |
| 5,652,434 | 7/1997 | Nakamura et al. | 257/103 |
| 5,670,798 | 9/1997 | Schetzina | 257/96 |
| 5,686,738 | 11/1997 | Moustakas | 257/103 |

FOREIGN PATENT DOCUMENTS

| | | |
|---|---|---|
| 551721 | 7/1991 | European Pat. Off. . |
| 334549 | 2/1991 | Japan . |

OTHER PUBLICATIONS

"New Transistors Take the Heat", *Machine Design*, Aug. 10, 1995; p. 36.

"High–Temperature GaN/SiC Heterojunction Bipolar Transistor with High Gain", J. Pankove et al., Dec. 1994 IEEE; pp. 15.6–15.6.4.

S.M. Sze, "Semiconductor Devices," 1985, p. 111.

"Emerging Gallium Nitride Based Devices" S.N. Mohammad, et al., Proceedings of the IEEE, vol. 83, No. 10, Oct. 1995, pp. 1306–1355.

"High–Temperature GaN/SiC Heterojunction Bipolar Transistor with High Gain" J. Pankove, et al., 1995 IEEE International Conference on Systems, Man and Cybernetics, 10 22–25, 1995 vol. 1, Oct., 22, 1995, Institute of Electronics Engineers, pp. 389–392.

"Status of Silicon Carbide (SiC) as a Wide–Bandgap Semiconductor for High–Temperature Application :A Review" J. B. Casady, et al. Solid–State Electronics vol. 39, No. 10. pp. 1409–1422, 1996.

"Extremely High Peak Specific Transconductance AlGaAs/GaAs Heterojunction Bipolar Transistors", Dean Barker, et al, IEEE Electron Device Letters, vol. 10, No. 7, (1989) Jul., pp. 313–315.

*Primary Examiner*—John Guay
*Attorney, Agent, or Firm*—Walter G. Sutcliff

[57] ABSTRACT

A heat tolerant, frequency responsive transistor for use in the microwave region includes a collector region, a base region overlying the collector region, and an emitter region including an AlGaN layer overlying at least part of said base region, forming a heterojunction between said base region and said emitter region. The emitter region may include two layers. The HBT may be mounted on a SiC or sapphire substrate. The HBT may include a buffer layer between the substrate and the collector region.

23 Claims, 3 Drawing Sheets

| $P_{out}$ W/mm at $f_{max}$(opt)/4 | HBT STRUCTURE E/B/C | $B_{fm}$ $\left(\dfrac{cm}{v^{1/2} s^{3/2} c}\right)$ | $C_{fm}$ $\left(\dfrac{v}{cm\ s^{3/2}}\right)$ | $f_t$ (OPT) (GHz) | $f_{max}$ (OPT) (GHz) | $\dfrac{FOM}{\left(\dfrac{cv}{s3}\right)}$ | $\dfrac{FOM}{(FOM)}\dfrac{AlGaAs}{GaAs}$ |
|---|---|---|---|---|---|---|---|
| 0.36 W | POLY-Si/SiGe/Si | $0.73 \times 10^{34}$ | $2.07 \times 10^{26}$ | 10.95 | 63.94 | $0.92 \times 10^{20}$ | 0.37 |
| 0.40 | AlGaAs/GaAs/GaAs | $1.79 \times 10^{34}$ | $2.25 \times 10^{26}$ | 10.57 | 99.40 | $2.46 \times 10^{20}$ | 1.00 |
| 0.48 | InP/InGaAs/InP | $3.17 \times 10^{34}$ | $3.14 \times 10^{26}$ | 14.01 | 141.67 | $6.08 \times 10^{20}$ | 2.47 |
| 4.10 | 6H-SiC/3C-SiC/4H-SiC | $0.45 \times 10^{34}$ | $35.78 \times 10^{26}$ | 25.48 | 62.00 | $9.83 \times 10^{20}$ | 4.00 |
| 4.10 | AlGaN/4H-SiC/4H-SiC | $0.45 \times 10^{34}$ | $35.78 \times 10^{26}$ | 25.48 | 62.00 | $9.83 \times 10^{20}$ | 4.00 |
| 8.96 | AlGaN/GaN/GaN/4H-SiC | $0.48 \times 10^{34}$ | $87.50 \times 10^{26}$ | 31.85 | 67.70 | $25.65 \times 10^{20}$ | 10.43 |
| 11.26 | SiC/Si/DIAMOND | $0.73 \times 10^{34}$ | $98.39 \times 10^{26}$ | 25.48 | 78.56 | $43.86 \times 10^{20}$ | 17.83 |

*FIG. 2*

ALUMINUM GALLIUM NITRIDE HETEROJUNCTION BIPOLAR TRANSISTOR

This application is a divisional of application Ser. No. 08/555,935, filed on Nov. 9, 1995, now U.S. Pat. No. 5,641,975, the entire contents of which are hereby incorporated by reference.

BACKGROUND OF THE INVENTION

1. Field of the Invention

The present invention is directed to heterojunction bipolar transistors (HBTs). More specifically, the present invention relates to HBTs for use as high power microwave amplifiers in S–X bands (3–12 GHz).

2. Description of the Related Art

The HBT concept is well known and has been successfully applied to several material systems e.g. $Al_xGA_{1-x}As/GaAs, Si_{1-x}Ge_x$ etc. Generally, the HBTs have been made on GaAs or Si substrates and suffer from three primary material limitations: (1) low electric breakdown field, (2) low saturated drift velocity of electrons, and (3) low thermal conductivity. All of these factors limit the power output of the device at a given frequency and the maximum frequency of operation.

Currently, silicon bipolar devices are being used in the UHF to S-Band frequency range while $Al_xGA_{1-x}As/GaAs$ HBTs are typically used at X-Band. $Si_{1-x}Ge_x$ HBTs are expected to outperform silicon bipolar transistors at S-band, with the possibility of operation to X-Band.

In the X-band, the $Al_xGA_{1-x}As/GaAs$ HBTs produce 3–4 W/mm of RF power at 10 GHz and at room temperature. In addition, both Si and GaAs HBTs are capable of working at a junction temperature of 150° C.

U.S. Pat. No. 4,985,742 to Pankove discloses a transistor in which an n-type gallium nitride layer and a p-type silicon carbide layer from a heterojunction. The n-type gallium nitride layer serves as the emitter, the p-type silicon carbide layer serves as the base and a n-type silicon carbide layer, formed beneath the p-type silicon carbide layer serves as the collector. As disclosed in the related articles, "New Transistors take the Heat", *Machine Design*, Aug. 10, 1995 p. 36 and Pankove et al., "High-Temperature GaN/SiC Heterojunction Bipolar Transistor with High Gain", December 1994 IEEE, pp. 15.6.1–15.6.4, such a device can operate at high temperatures (up to 500° C.) and have high current gains (greater than $10^5$ at room temperature and around 100 at 500° C.)

However, the need still exists for high power transistors for use in the microwave region, especially one having improved frequency response at around 3–12 GHz. The HBT structure disclosed by Pankove does not address microwave applications and is not designed for operation at high frequencies.

SUMMARY OF THE INVENTION

It is therefore an object of the present invention to provide a heat tolerant, frequency responsive transistor for use in the microwave region. It is a further object of the present invention to provide a transistor for practical use in the S–X band (3–12 GHz).

These and other objects of the present invention may be achieved by providing an HBT which includes a collector region, a base region overlying the collector region, and an emitter region including an AlGaN layer overlying at least part of the base region, forming a heterojunction between the base region and the emitter region. The emitter region may include two layers. The HBT may be mounted on a SiC or sapphire substrate. The HBT may include a buffer layer between the substrate and the collector region.

These and other objects of the present invention will become more readily apparent from detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limited to the present invention and wherein:

FIG. 2 is a table showing the overall figure of merit for candidate devices.

DETAILED DESCRIPTION OF THE PREFERRED EMBODIMENTS

Figure 1A:
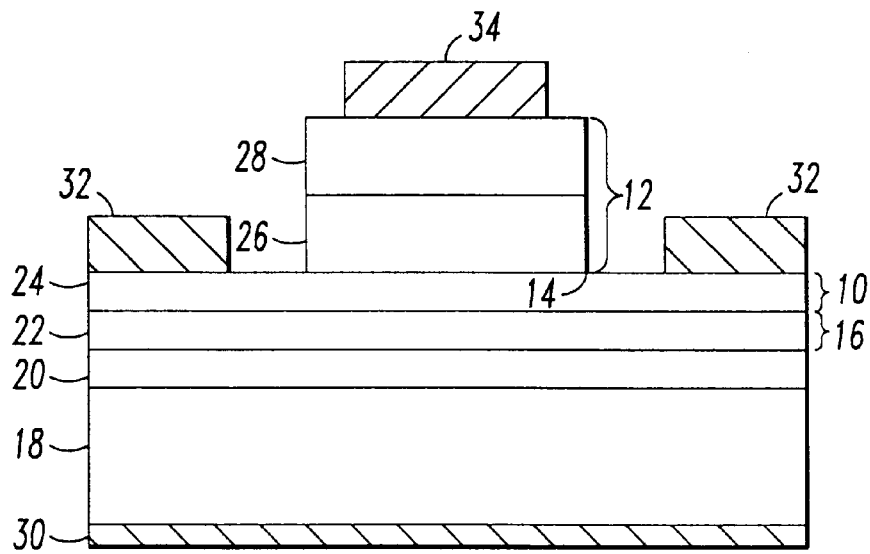
FIG. 1a illustrates the structure of an HBT of a first embodiment of the present invention.

In constructing HBTs as shown, for example, in FIGS. 1a–1d, a base 10 is doped higher than an emitter 12 to reduce the base resistance at the expense of current gain. As long as the current gain is higher than ten, it does not impact the power gain or efficiency. Indeed, too high (e.g., over 100) a current gain reduces the common emitter breakdown voltage and causes oscillations. Thus, the main functional difference between the present invention and the Pankove HBT is that while Pankove's HBT is designed to have a current gain of 1 million at room temperature, the HBT of the present invention has a current gain of only 10–100, but improved high frequency response A heterojunction at a base-emitter junction 14 allows the base 10 to be doped heavily without dropping the current gain below ten. This allows the thickness of the base to be reduced below 1000 Å to improve frequency response while maintaining an acceptable base resistance.

It is beneficial to only slightly dope the emitter 12 in order to reduce the base-emitter capacitance. The higher base doping also distributes the current uniformly throughout the emitter length.

The materials of a collector 16 and the base 10 are generally the same to avoid any heterojunction which can impede the current flow. The material of the collector 16 needs to have a high saturated drift velocity VS and a high breakdown field EC. A high value of the breakdown field allows the thickness of the collector 16 to remain low for a given breakdown voltage. This low thickness, in conjunction with the high drift velocity, minimizes the delay in the collector 16, leading to a higher cut-off frequency and thus improved microwave performance.

In assessing various transistor structures and candidate transistor materials, a figure of merit (FOM) was defined as follows:

$$FOM = P_{out} fo^2 \quad (1)$$

in which $P_{out}$ is power output and fo is the operating frequency. Thus, the unit of the FOM is $CV/S^3$.

The FOM may equivalently be expressed as follows:

$$FOM = K_G L_{fm} B_{fm} C_{fm} \quad (2)$$

where $$K_G = K_\theta K_v (0.8) K_f^2 (0.29)^2 q^2 (kT/q)^2$$

letting $K_\theta=0.1$, $K_v=0.2$, $K_f=0.25$ for a particular class of operation (the overall FOM will still be directly proportional for all classes for the product of the individual figures of merit discussed below) then $$K_G = 3.47 \times 10^{-43} C^2 V^{1/2}$$

$L_{fm}$ is the layout figure of merit (dimensionless) and is defined as:

$$L_{fm} = A_E / L^2 F_C \quad (3)$$

where $A_E$ is the total emitter area of the layout, L is the size of the single emitter in the length direction of the layout, and $F_C$ is the ratio of the total collector area in the layout to the total emitter area in the layout. For the following comparison, the array of HBTs was constructed such that the layout figure of merit was equal to 176.

$B_{fm}$ is the base figure of merit (in $c_m/(V^{1/2} \cdot s^{3/2} \cdot C)$) and is defined as:

$$B_{fm} = (\mu_{nb})^{1/2} \mu_{pb} N_b / \epsilon_s \quad (4)$$

where $\mu_{nb}$ is the mobility of electrons in the base, $\mu_{pb}$ is the mobility of holes in the base, $N_b$ is the density of p-type acceptors in the base and $\epsilon_s$ is the permittivity of the material ($8.86 \times 10^{-14}$ times the dielectric constant).

Finally, $C_{fm}$ is the collector figure of merit (in $V/(cm \cdot s^{3/2})$) defined as:

$$C_{fm} = v_s^{3/2} W_c^{3/2} N_c E_c \quad (5)$$

where $W_c$ is the thickness of the collector, and $N_c$ is the number of dopants in the collector.

Table 1 below illustrates $B_{fm}$ for various candidate base materials

TABLE 1

Base FOM

| Base Material | K | $\mu_n$(cm²/vs) | $\mu_p$(cm²/vs) | $B_{fm}$ (npn) $\left(\frac{cm}{v^{1/2}s^{3/2}C}\right)$ | $\frac{B_{fm}}{B_{fm}(GaAs)}$ |
|---|---|---|---|---|---|
| Ge | 16.0 | 950 | 110 | $2.39 \times 10^{34}$ | 1.33 |
| Si | 11.9 | 105 | 75 | $0.73 \times 10^{34}$ | 0.40 |
| GaAs | 13.1 | 1200 | 60 | $1.79 \times 10^{34}$ | 1.00 |
| GaInAs | 13.77 | 1500 | 100 | $3.17 \times 10^{34}$ | 1.77 |
| InP | 12.35 | 1000 | 30 | $0.87 \times 10^{34}$ | 0.49 |
| InAs | 14.55 | 2800 | 90 | $3.69 \times 10^{34}$ | 2.06 |
| GaN | 9.5 | 100 | 40 | $0.48 \times 10^{34}$ | 0.27 |
| 3C-SiC | 10.0 | 100 | 40 | $0.45 \times 10^{34}$ | 0.25 |
| 4H-SiC | 10.0 | 100 | 40 | $0.45 \times 10^{34}$ | 0.25 |

It is evident that GaN and SiC are inferior base materials because of low electron and hole mobilities. However, the choice of the base material is not totally arbitrary and should not be considered in isolation because its characteristics will also depend upon those of the underlying collector material. A heterojunction between the base and collector is not desirable because it can impede the flow of carriers. Thus, the collector figure of merit also must be considered, as shown in Table 2 below.

TABLE 2

Collector FOM

| Collector Material | $V_s$(cm/s) | $E_c$(v/cm) | $C_{fm}\left(\frac{v}{cm s^{3/2}}\right)$ | $BV_{CBO(ideal)} = w_c E_c$ | $\frac{C_{fm}}{C_{fm}(GaAs)}$ |
|---|---|---|---|---|---|
| Si | $0.86 \times 10^7$ | $0.41 \times 10^6$ | $2.07 \times 10^{26}$ | 41.00 v | 0.92 |
| GaAs | $0.83 \times 10^7$ | $0.47 \times 10^6$ | $2.25 \times 10^{26}$ | 47.00 | 1.00 |
| InP | $1.1 \times 10^7$ | $0.43 \times 10^6$ | $3.14 \times 10^{26}$ | 43.00 | 1.40 |
| 4H-SiC | $2.0 \times 10^7$ | $2.00 \times 10^6$ | $35.78 \times 10^{26}$ | 200.00 | 15.90 |
| GaN | $2.5 \times 10^7$ | $3.50 \times 10^6$ | $87.50 \times 10^{26}$ | 350.00 | 38.89 |
| Diamond | $2.0 \times 10^7$ | $5.5 \times 10^6$ | $98.39 \times 10^{26}$ | 550.00 | 43.73 |

The overall FOM for various HBT structures is shown in the table in FIG. 2. Therefore, the HBT systems of interest are AlGaN/4H-SiC/4H-SiC and AlGan/GaN/GaN, especially on a SiC substrate as shown in the table of FIG. 2. AlGaN allows more flexibility in creating band gap differences in controlling junction characteristics. Diamond, also shown in this table, is impractical to fabricate.

The HBT shown in FIG. 1a, includes a base 10 including a layer 24; an emitter 12, including layers 26, 28; a collector 16 including a layer 22; a buffer layer 20; a substrate 18; a collector contact 30; a base contact 32; and an emitter contact 34. The buffer layer 20 serves to improve the breakdown voltage of the base-collector junction. The double base contact 32 reduces the base resistance which is important for superior microwave performance.

Preferably, the base 10 is made of SiC, the emitter 12 is made of AlGaN and the collector 16 is made of SiC. In one preferred embodiment, the substrate 18 is N+ 4H or 6H SiC, the buffer layer 20 is N− 4H or 6H SiC, the collector layer 22 is N 4H or 6H SiC, the base layer 24 is P+ 4H or 6H SiC, the emitter layer 26 is N AlGaN (hexagonal), and the emitter layer 28 is N+ AlGaN (hexagonal). The layers are formed in a conventional manner. The contacts 30, 32, and 34 are all of conventional contact material. When the buffer layer is 6H or 4H SiC doped layer, it serves to shield the collector field from the substrate, thus preventing premature breakdown.

Alternatively, in the embodiment shown in FIG. 1a, the substrate is N+ 4H or 6H SiC, the buffer layer 20 is N+ 4H or 6H Sic, the collector layer 22 is N 4H or 6H Sic, the base layer 24 is P+ 4H or 6H SiC, the emitter layer 26 is N AlGaN (hexagonal), and the emitter layer 28 is N+ GaN (hexagonal).

Figure 1B:
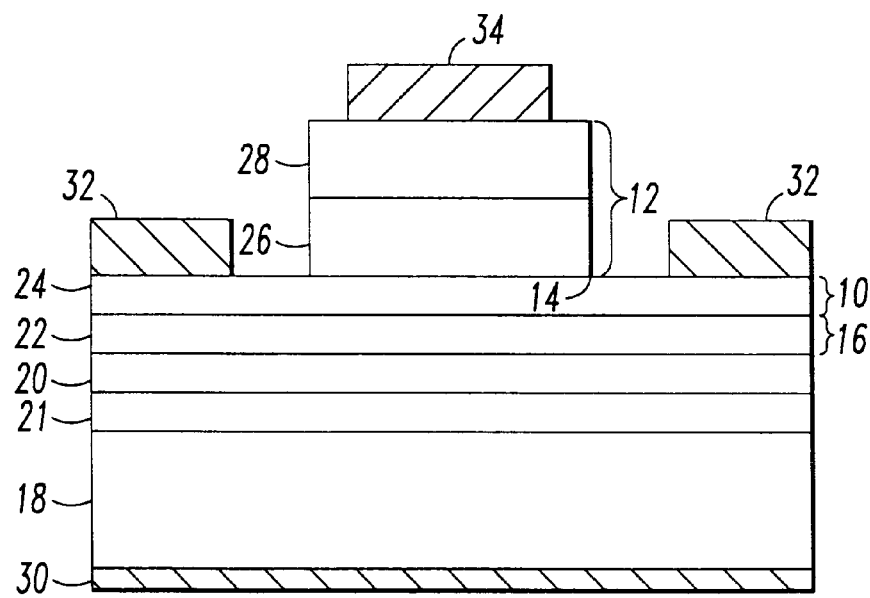
FIG. 1b illustrates the structure of an HBT of a second embodiment of the present invention.

A second embodiment of the present invention is as shown in FIG. 1b, in which the structure shown in FIG. 1a includes an additional buffer layer 21. The substrate 18, the collector contact 30, the base contact 32, the emitter contact 34, and the emitter layers 26, 28 may be either of the alternatives set forth in above in connection with FIG. 1a. The additional buffer layer 21 is preferably N+ GaN (hexagonal) In the embodiment shown in FIG. 1b, the collector layer 22 is preferably N GaN (hexagonal) and the base layer 24 is preferably P+ GaN (hexagonal).

The use of SiC as the material for the substrate 18 is critical in the embodiments shown in FIG. 1a and 1b because SiC has a high thermal conductivity, i.e., three times higher than that of Si and six times higher than that of GaN, conventionally used for substrates. Thus, the use of a SiC substrate allows more heat to be removed from the device and thus more RF power can be output.

Figure 1C:
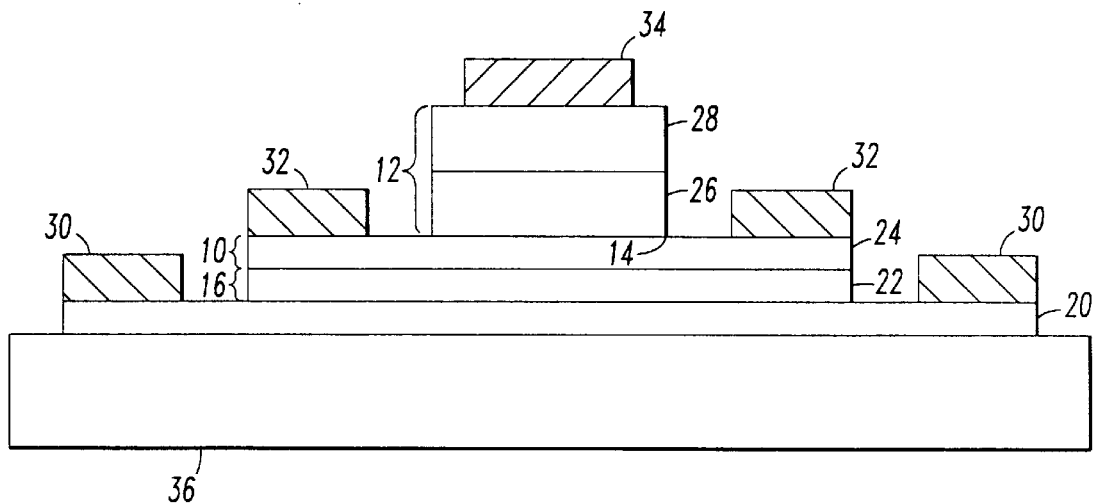
FIG. 1c illustrates the structure of an HBT of a third embodiment of the present invention.

A third embodiment of the present invention is shown in FIG. 1c, in which any of the above structures described in connection with FIG. 1a and 1b, with or without the buffer layer 21, are mounted on a semi-insulating substrate 36 of 4H or 6H SiC. This embodiment retains some of the heat removal of SiC layer 18, while the use of a semi-insulating SiC substrate minimizes parasitics, thus enhancing the microwave performance of the HBT.

Figure 1D:
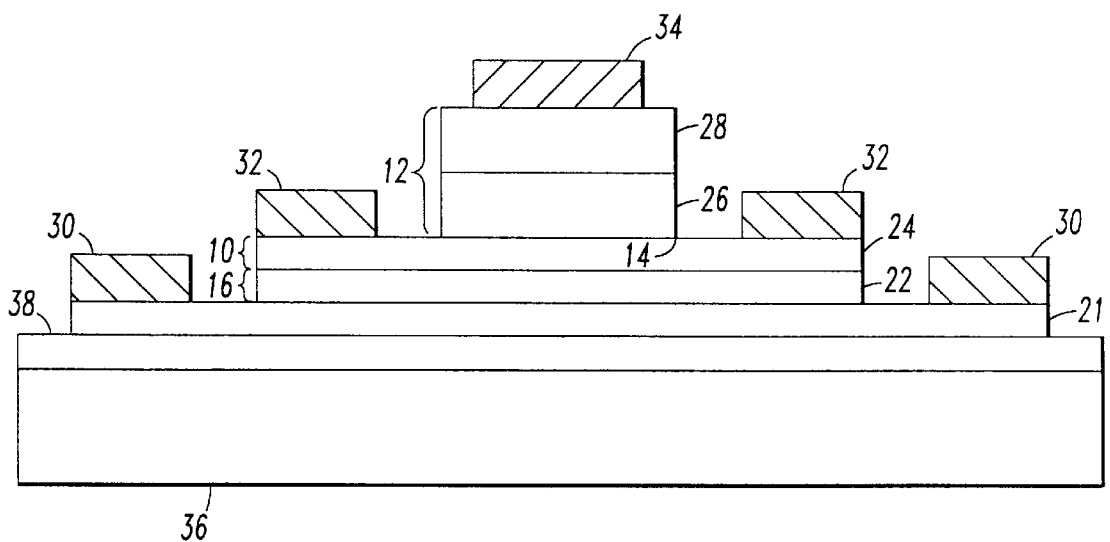
FIG. 1d illustrates the structure of an HBT of a fourth embodiment of the present invention.

A fourth embodiment of the present invention is shown in FIG. 1d, in which the structures described above in connection with FIG. 1b are mounted on the substrate 36 and having a buffer layer 38 between the collector layer 18 and the substrate 36. Preferably, the substrate 36 is sapphire and the buffer layer 38 is semi-insulating, undoped AlN (hexagonal). Sapphire does not provide the heat conducting advantages of SiC, but the large area of the substrate 36 makes the HBT easier to fabricate and lowers the cost of the device, while sacrificing some performance advantage due to not using SiC. Often cost is a major factor, and SiC substrates are very expensive and only exist in 2 inch diameters Sapphire can be obtained in 5–6 inch diameters. Thus, some applications may desire to forego some high power density, shown in column 1 of FIG. 2, for cost and size considerations.

In the structures shown in FIGS. 1a–1d, the two-layer AlGaN in the emitter region and the SiC or GaN collector help overcome all the three major limitations described in the background section. The heterostructure created by using an $Al_xGa_{1-x}N$ layer in the emitter provides a higher bandgap region and prevents the injection of holes from the p-type base. This allows the doping in the base region to be raised without degrading the current gain and thus lower the base spreading resistance. The resulting higher base conductivity helps distribute the emitter current more evenly and increases the maximum frequency of operation, $f_{max}$, for a given cut-off frequency, $f_t$. The $f_t$ in turn depends primarily on the delay in the collector region which can be made very narrow (<1 $\mu$m) and highly doped ($5\times10^{16}$/cm$^3$) by taking advantage of the high breakdown field of the SiC. The high doping in the collector in combination with high saturated drift velocity of electrons ($2\times10^7$ cm/sec) increases the collector current per unit of emitter area, thus increasing the power output per unit area and also reducing the delay associated with charging the emitter capacitance. The higher thermal conductivity of the substrate helps remove heat efficiently. The leakage currents associated with electron-hole pair generation ($n_i^2$) are negligible in SiC and GaN up to 400° C. due to the higher bandgap of SiC and GaN.

Thus, the transistor of the present invention is capable of operating at high junction temperatures. This transistor is capable of providing 10 W/mm of RF power at 10 GHz and at room temperature, which is more than twice the power as the 3–4 W/mm the existing AlGaAs/GaAs HBT technology provides. This transistor may now be used to construct systems having higher power densities, lower chip area, reduced cooling requirements, and reduced weight.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heterojunction bipolar transistor comprising:

a collector region;

a base region overlying at least part of said collector region, said base region comprising a P+ GaN layer; and an emitter region comprising at least one AlGaN layer overlying at least part of said base region, forming a heterojunction between said base region and said emitter region.

2. The heterojunction bipolar transistor as recited in claim 1, wherein said emitter region comprises two AlGaN layers.

3. The heterojunction bipolar transistor as recited in claim 1, wherein said emitter region comprises an N AlGaN layer and an N+ AlGaN layer overlying said N AlGaN layer.

4. The heterojunction bipolar transistor as recited in claim 1, further comprising a SiC substrate on which said collector layer is mounted.

5. The heterojunction bipolar transistor as recited in claim 4, further comprising a buffer layer between said SiC substrate and said collector region.

6. The heterojunction bipolar transistor as recited in claim 1, further comprising a sapphire substrate on which said collector region is mounted.

7. The heterojunction bipolar transistor as recited in claim 6, further comprising a buffer layer between said sapphire substrate and said collector region.

8. The heterojunction bipolar transistor as recited in claim 1, further comprising a semi-insulating SiC substrate on which said collector layer is mounted.

9. The heterojunction bipolar transistor according to claim 1, wherein said emitter region comprises an N AlGaN layer and an N+ GaN layer overlying said N AlGaN layer.

10. The heterojunction bipolar transistor according to claim 1, wherein said transistor operates in a microwave region.

11. A heterojunction bipolar transistor comprising:

a collector region, said collector region comprising a N GaN layer;

a base region overlying at least part of said collector region; and an emitter region including at least one AlGaN layer overlying at least part of said base region, forming a heterojunction between said base region and said emitter region.

12. The heterojunction bipolar transistor as recited in claim 11, wherein said emitter region comprises two AlGaN layers.

13. The heterojunction bipolar transistor as recited in claim 11, wherein said emitter region comprises an N AlGaN layer and an N+ AlGaN layer overlying said N AlGaN layer.

14. The heterojunction bipolar transistor as recited in claim 11, further comprising a SiC substrate on which said collector layer is mounted.

15. The heterojunction bipolar transistor as recited in claim 14, further comprising a buffer layer between said SiC substrate and said collector region.

16. The heterojunction bipolar transistor as recited in claim 11, further comprising a sapphire substrate on which said collector region is mounted.

17. The heterojunction bipolar transistor as recited in claim 16, further comprising a buffer layer between said sapphire substrate and said collector region.

18. The heterojunction bipolar transistor as recited in claim 11, further comprising a semi-insulating SiC substrate on which said collector layer is mounted.

19. The heterojunction bipolar transistor according to claim 11, wherein said emitter region comprises an N AlGaN layer and an N+ GaN layer overlying said N AlGaN layer.

20. The heterojunction bipolar transistor according to claim 11, wherein said transistor operates in a microwave region.

21. An AlGaN/GaN/GaN heterojunction bipolar transistor comprising:

a collector region comprising an N GaN layer;

a base region comprising a P+ GaN layer overlying at least part of said collector region, said base region;

an emitter region including at least one AlGaN layer overlying at least part of said base region and forming a heterojunction between said base region and said emitter region; and a SiC or sapphire substrate on which said collector region is mounted.

22. The heterojunction bipolar transistor as recited in claim 21 and further comprising a pair of buffer layers between said substrate and said collector region and wherein one of said buffer layers comprises an N+ GaN layer.

23. The heterojunction bipolar transistor as recited in claim 21 wherein said transistor operates in the S–X band (3–12 GHz).

* * * * *